United States Patent
Niles et al.

(10) Patent No.: US 9,134,347 B2
(45) Date of Patent: Sep. 15, 2015

(54) RARE ANOMALY TRIGGERING IN A TEST AND MEASUREMENT INSTRUMENT

(71) Applicant: Tektronix, Inc., Beaverton, OR (US)

(72) Inventors: Tyler B. Niles, Beaverton, OR (US); Craig H. Nelson, Hillsboro, OR (US); James D. Alley, Newberg, OR (US)

(73) Assignee: TEKTRONIX, INC., Beaverton, OR (US)

( * ) Notice: Subject to any disclaimer, the term of this patent is extended or adjusted under 35 U.S.C. 154(b) by 494 days.

(21) Appl. No.: 13/632,971

(22) Filed: Oct. 1, 2012

(65) Prior Publication Data
US 2014/0095098 A1    Apr. 3, 2014

(51) Int. Cl.
*G06F 19/00*    (2011.01)
*G01R 13/02*    (2006.01)

(52) U.S. Cl.
CPC .................................. *G01R 13/0263* (2013.01)

(58) Field of Classification Search
USPC .................... 702/85, 117, 118, 182–185, 188
See application file for complete search history.

(56) References Cited

U.S. PATENT DOCUMENTS

2009/0319295 A1 *    12/2009    Kass-Hout et al. ............... 705/2

* cited by examiner

*Primary Examiner* — Edward Raymond
(74) *Attorney, Agent, or Firm* — Michael A. Nelson; Marger Johnson

(57) ABSTRACT

A test and measurement instrument and method of detecting an anomaly in a test and measurement instrument are disclosed. The test and measurement instrument includes an input terminal configured to receive a signal. An acquisition engine is coupled to the input terminal, the acquisition engine being configured to digitize the signal and store the digitized signal as a signal history in an acquisition memory based on initial trigger settings. An anomaly detector is coupled to the acquisition memory, the anomaly detector being configured to detect an anomaly in the signal history. An analysis engine is coupled to the anomaly detector, the analysis engine being configured to analyze the anomaly detected in the signal history and generate modified trigger settings for detecting the anomaly. Trigger circuitry is coupled to the analysis engine, the trigger circuitry being configured to trigger based on the modified trigger settings.

19 Claims, 5 Drawing Sheets

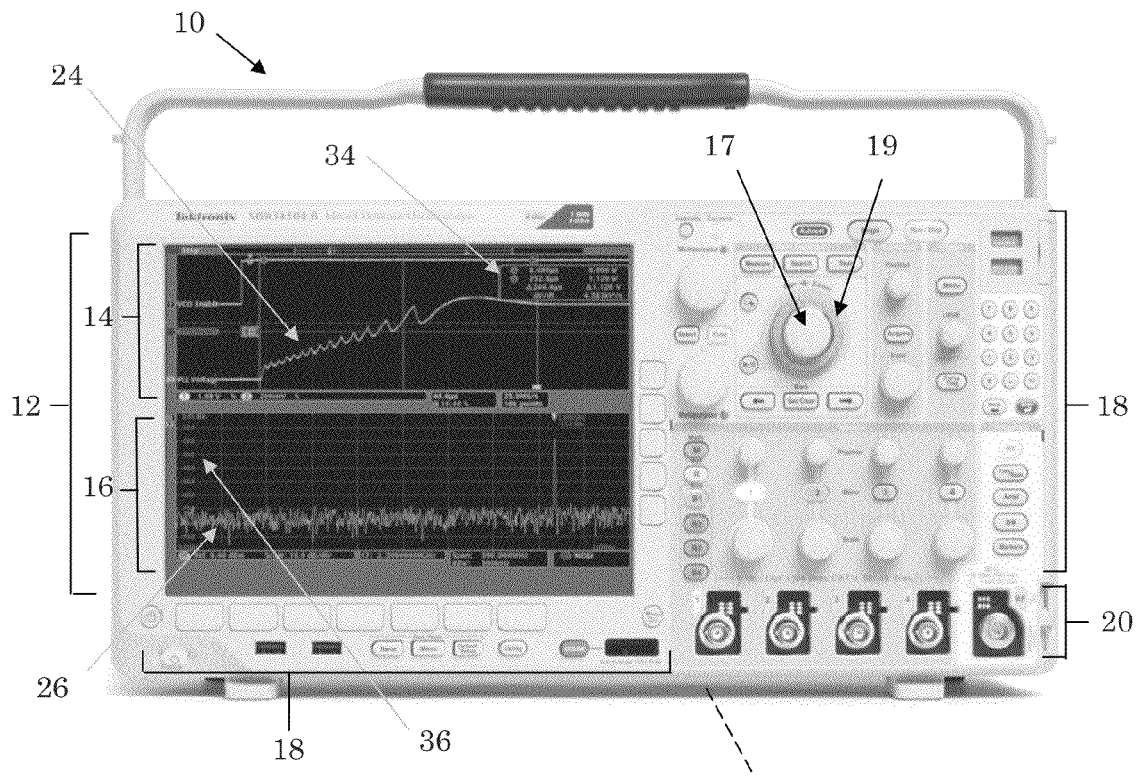
Figure 1
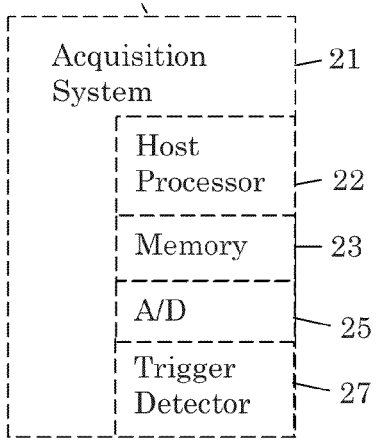

RARE ANOMALY TRIGGERING IN A TEST AND MEASUREMENT INSTRUMENT

FIELD OF INVENTION

This invention relates to the field of test and measurement instruments and in particular rare anomaly triggering techniques.

BACKGROUND

Modern digital oscilloscopes generally provide the capability to generate a waveform of a given input signal. Such test and measurement instruments are equipped with triggering hardware and software that is configurable to capture a desired event. "Rare anomaly" triggering highlights the ability of an instrument to detect infrequent electrical glitches. Many low- and mid-range instruments can miss these anomalies due to the 'dead time' during post-acquisition processing. Accordingly, there exists a need to provide improved triggering techniques that can improve rare anomaly triggering capabilities of such test and measurement instruments.

SUMMARY OF THE INVENTION

A test and measurement instrument and method of detecting an anomaly in a test and measurement instrument are disclosed. The test and measurement instrument includes an input terminal configured to receive a signal. An acquisition engine is coupled to the input terminal, the acquisition engine being configured to digitize the signal and store the digitized signal as a signal history in an acquisition memory based on initial trigger settings. An anomaly detector is coupled to the acquisition memory, the anomaly detector being configured to detect an anomaly in the signal history. An analysis engine is coupled to the anomaly detector, the analysis engine being configured to analyze the anomaly detected in the signal history and generate modified trigger settings for detecting the anomaly. Trigger circuitry is coupled to the analysis engine, the trigger circuitry being configured to trigger based on the modified trigger settings.

The anomaly detector may be configured to detect the anomaly based on at least one of a mask event, segmented memory and an acquisition histogram. The acquisition engine may be configured to acquire a predetermined number of acquisitions as a signal history. The analysis engine may be configured to generate a mask based on the signal history. The analysis engine may be configured to receive a user input specifying a location of the anomaly. The anomaly detector may be configured with at least one threshold criteria for detecting the anomaly. The analysis engine may be configured to automatically select at least one anomaly detection technique from a plurality of anomaly detection techniques. The analysis engine may be configured to automatically select one anomaly detection technique from a plurality of anomaly detection techniques based on a score. The initial trigger settings may be configured to capture a history of the signal independent of the anomaly.

A method of detecting an anomaly in a test and measurement instrument includes receiving a signal and then digitizing the signal and storing the digitized signal as a signal history in an acquisition memory based on initial trigger settings. An anomaly is detected in the signal history. The anomaly detected in the signal history is analyzed and modified trigger settings are generated. The modified trigger settings are configured to detect the anomaly. The trigger circuitry is configured to trigger based on the modified trigger settings.

The anomaly may be detected based on at least one of a mask event, segmented memory and an acquisition histogram. A predetermined number of acquisitions may be acquired as a signal history. A mask may be generated based on the signal history. A user input may be received specifying a location of the anomaly. The anomaly may be detected based on at least one threshold criteria.

At least one anomaly detection technique may be automatically selected from a plurality of anomaly detection techniques. One anomaly detection technique may be selected from a plurality of anomaly detection techniques based on a score. The initial trigger settings may be configured to capture a history of the signal independent of the anomaly. A second signal may be received and the test and measurement instrument may trigger based on the modified trigger settings.

BRIEF DESCRIPTION OF THE FIGURES

FIG. 1 is a diagram of a mixed domain oscilloscope having a display that is divided into a plurality of display areas;

DETAILED DESCRIPTION OF THE INVENTION

Figure 2:
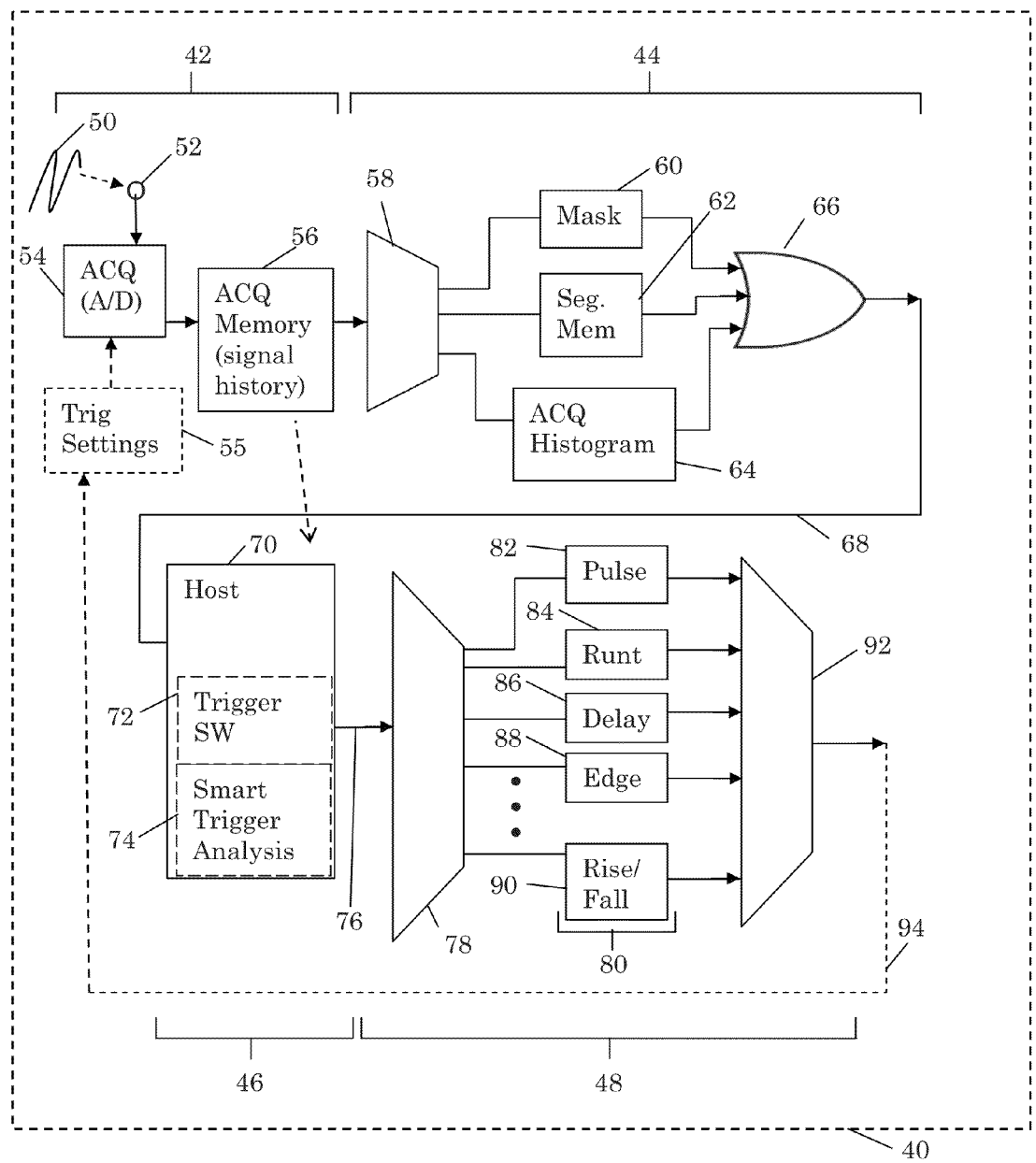
FIG. 2 is a block diagram of an acquisition system configured for improved rare anomaly triggering.

Disclosed herein are improved rare anomaly triggering techniques (smart triggering). Such techniques may be implemented in hardware and/or software and provide an improved operating mode for test and measurement instruments such as oscilloscopes. Smart triggering mode may be generally implemented as follows: the oscilloscope A) captures a number of (n) acquisitions; B) establishes an effective "signal history"; C) continues acquiring while searching for any signal which does not match the signal history, e.g. rare anomalies; and D) once a signal history violation is detected, the trigger settings are modified so as to only trigger on the learned anomaly. Trigger settings may include trigger types such as runt, level, pulse width and sequence as well as parameters such as level threshold, rising or falling edge, leading/trailing/negative/positive pulse and the like. As described herein, the smart trigger result essentially eliminates the post-acquisition dead time spent processing known signal data and instead dedicates this otherwise lost time to searching for valuable signal anomaly data. This allows the scope user to see how often the anomaly is occurring and analyze the device under test accordingly.

Detecting anomalies may be handled by a variety of techniques available to the user, e.g., mask testing and waveform histogram, and host processing. The disclosed techniques include the capability to intelligently decide which trigger detection method would best to show an infrequent event. For example, the trigger setup may use any trigger type available to the user such as runt, level, pulse width, sequence or other trigger types to trigger on the anomaly. Dead time is eliminated by using smart triggering to only acquire the desired anomaly.

Smart triggering may operate automatically, semi-automatically and manually. If used in conjunction with mask failures, an automatic mode may be used to detect anomalies in a sequence of (n) acquisitions and arrange trigger settings without user intervention. When in semi-automatic mode, the sequence of (n) acquisitions may be analyzed in accordance with user-defined signal threshold settings. Trigger settings may be set to only classify a violation as an anomaly when certain threshold criteria apply, similar to mask limit testing.

For explicit user intervention, manual mode can be utilized to allow the user to specify the number of (n) acquisitions. The user may manually inspect this acquisition history, e.g., stored in segmented memory, marking user-selected anomalies for smart triggering to process the necessary trigger settings.

FIG. 1 is a diagram of a test and measurement instrument (oscilloscope) 10 having a display 12 that is divided into a plurality of display areas or graticules 14, 16. The graticules or display areas 14, 16 are configured to graphically display at least one waveform 24, 26 and other graphical indicia 34, 36 for example axes, graphical information and text. The oscilloscope 10 also has a plurality of user controls 18 configured for user input and a plurality of electrical inputs 20 configured to receive test signals and the like. In this example, user controls 18 include a zoom input 17 (inner knob) and a pan input 19 (outer knob) configured to vary the zoom factor and pan position (zoom box position).

In this example, the oscilloscope 10 is implemented as a stand-alone unit with an acquisition system 21 including a processor 22 having an associated memory 23 configured for storage of program information and data. It should be understood that processor 22 may be coupled to additional circuitry, e.g., I/O, graphics generation hardware and the like. The processor 22 is configured to receive at least a portion of the inputs via the user controls 18. Analog to digital (A/D) converter 25 is configured to digitize signals received on electrical inputs 20. Trigger detector (trigger system) 27 provides timing signals for controlling the acquisition process as discussed below. A variety of triggering modes is disclosed in U.S. Pat. No. 7,191,079 which is incorporated herein in its entirety.

The processor 22 is also configured to generate at least a portion of the information displayed in the graticules 14, 16. It should be understood that the oscilloscope may be implemented using a variety of hardware and software including embodiments implemented using computing devices, e.g., desktop, laptop, tablet, smart phone or other computing devices, and that some of these systems may or may not provide or require a display device. A digitizer is an example of a system without a display or graticules.

FIG. 2 is a block diagram of an acquisition system 40 configured for improved rare anomaly triggering. The acquisition system 40 includes acquisition and signal history circuitry 42 configured to acquire a test signal and develop a signal history, detection circuitry 44 configured to use one or more detection methods to find an anomaly, an analysis engine 46 configured to analyze the detected anomaly, e.g., via a host processor, and trigger circuitry 48 which may be configured to trigger based on the detected anomaly.

The acquisition system 40 includes an electrical input 52 configured to receive a test signal 50. The electrical input 52 is coupled to an acquisition engine 54 configured to digitize the test signal 50, e.g., using an analog to digital (A/D) converter. Initial trigger settings (block 55) are configured to acquire a signal history, e.g., edge trigger, and acquire (n) acquisitions of the signal. That is, the initial trigger settings are configured to capture a signal history independent of the anomaly rather than trigger on a specific anomaly. The acquisition engine 54 is coupled to an acquisition memory 56 configured to store the signal history of the digitized test signal. The acquisition memory 56 is coupled to one or more anomaly detectors 60, 62, 64 via multiplexer 58. The anomaly detectors are coupled to an OR gate 66 having an output 68 coupled to the analysis portion 46 of the acquisition system 40. It should be understood that the functionality of multiplexer 58 and OR gate 66 may be provided by other circuit configurations. Such circuitry may provide the capability to allow one or more anomaly detectors to access the signal history and generate an output for subsequent analysis and trigger setting generation.

Figure 3A:
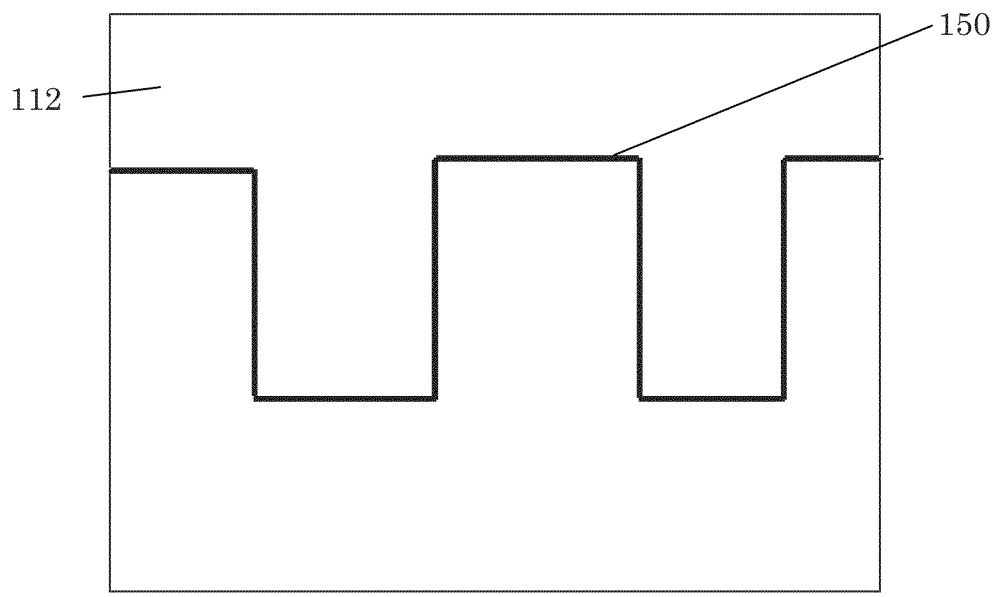
FIG. 3a is a simplified diagram of a display showing a test signal that will be subjected to mask testing.
Figure 3B:
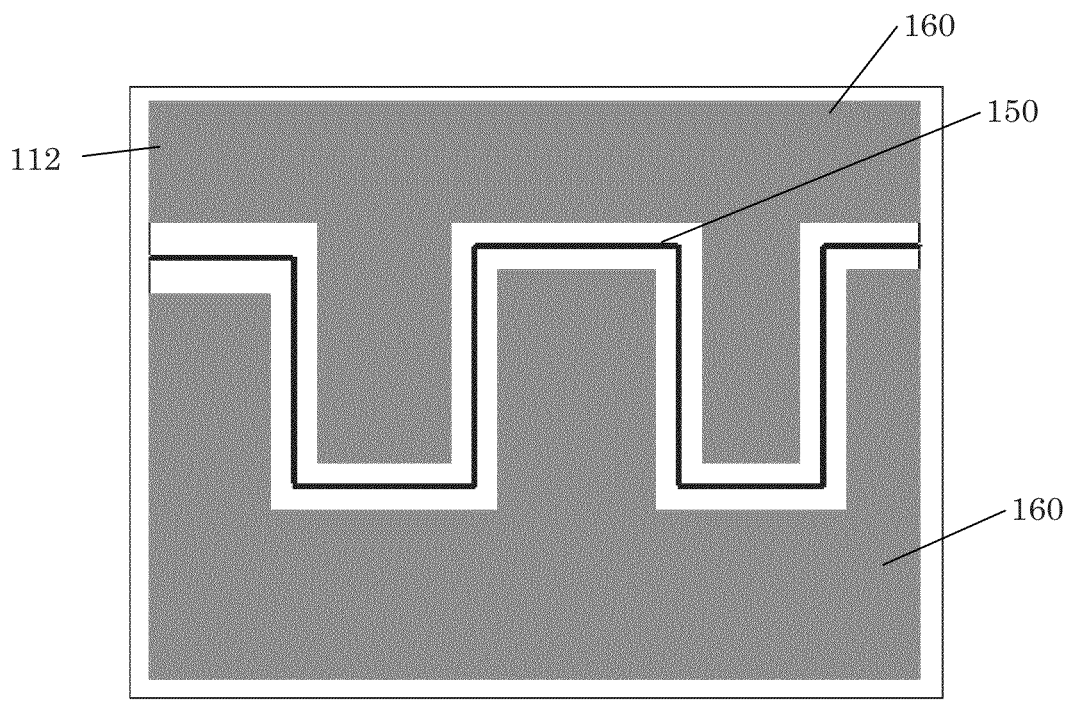
FIG. 3b is a simplified diagram of a display showing a mask surrounding the test signal.
Figure 3C:
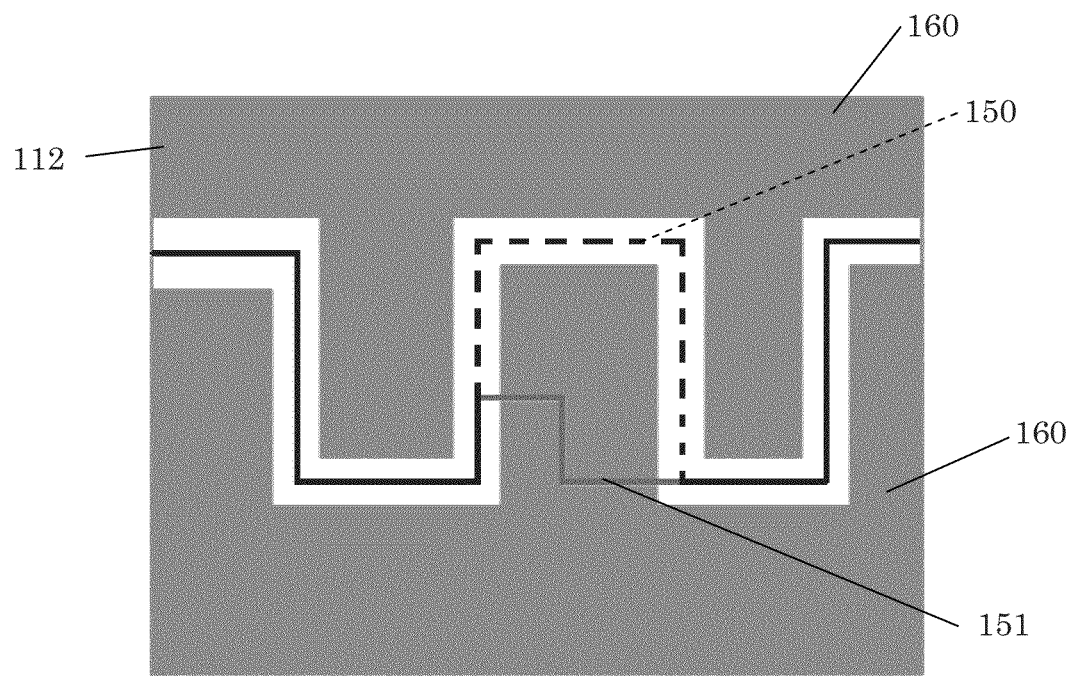
FIG. 3c is a simplified diagram of a display showing an acquisition with a mask event or violation when an anomaly is detected.
Figure 3D:
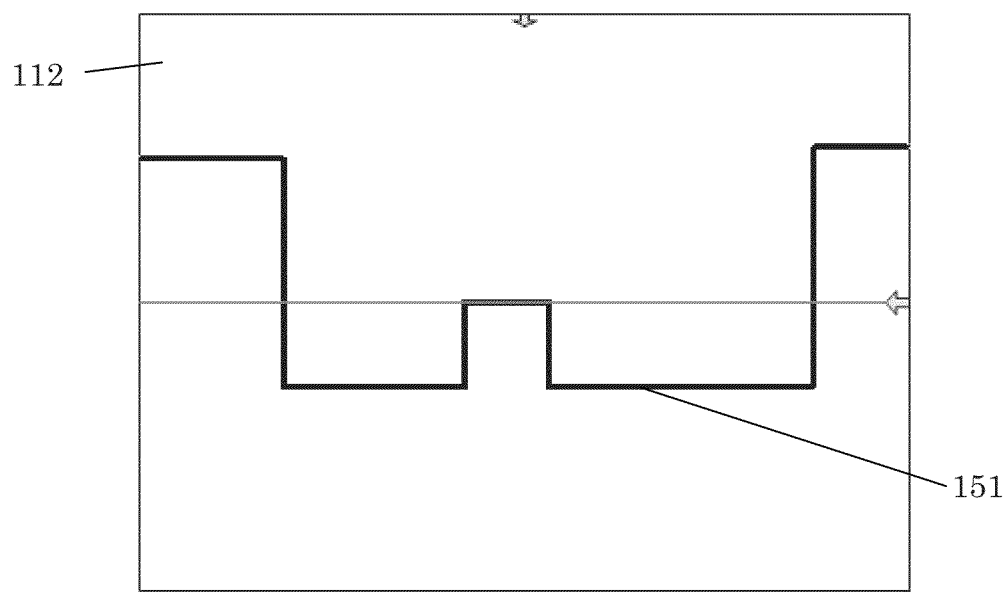
FIG. 3d is a simplified diagram of a display showing a display following the mask event.

In FIG. 2, a mask anomaly detector 60 is configured to monitor a mask boundary and detect when the signal history violates the mask boundary. FIG. 3a is a simplified diagram of a display 112 showing a test signal 150. The test signal 150 may be used to develop a signal history after a number of acquisitions (n). FIG. 3b is a simplified diagram of a display 112 showing a mask 160 surrounding the test signal 150. The mask is developed after the specified number of acquisitions (n) is completed. FIG. 3c is a simplified diagram of a display 112 showing an acquisition with a mask event or violation when an anomaly 151 is detected. FIG. 3d is a simplified diagram of a display 112 showing a display following the mask event.

A segmented memory 62 may also be used to detect an anomaly. Segmented memory generally allows a user to visually review the signal history and hand-select a given waveform that is either a known-good waveform or a known-bad waveform. A known-good waveform may be ignored by the Smart Trigger analysis, or a known-bad waveform may be used as a direct input to the Smart Trigger analysis. An acquisition histogram 64 may also be used to detect an anomaly. Acquisition histograms allow the abstraction of waveform shape so that any waveform can be reliably monitored for drastic changes. For a given waveform, a specific and relatively constant histogram will be generated. When an anomaly is acquired, the histogram will deviate from what is expected, indicating an anomaly has occurred. It should be understood that other anomaly detection techniques may be used without departing from the scope of this disclosure.

Continuing with FIG. 2, the output 68 of the detection circuitry 44 is coupled to analysis circuitry 46. The analysis circuitry 46 includes a host processor 70 configured with trigger software 72 and smart trigger analysis software 74. In general, the host processor via the trigger software 72 may access the acquisition memory 56 and analyze the anomaly.

The smart trigger analysis software 74 may operate manually, semi-automatically or automatically in accordance with the discussion above. In manual mode a user may specify the number of (n) acquisitions. The user may manually inspect this acquisition history stored in the acquisition memory 56 and mark user-selected anomalies for smart triggering to process the necessary trigger settings.

In semi-automatic mode, the sequence of (n) acquisitions may be analyzed in accordance with a user-defined signal setting. Trigger settings may be set to only classify a violation as an anomaly when certain threshold criteria apply, similar to mask limit testing. Such settings may be stored in a memory accessible to the host processor. See e.g., memory 23 in FIG. 1.

Figure 4:
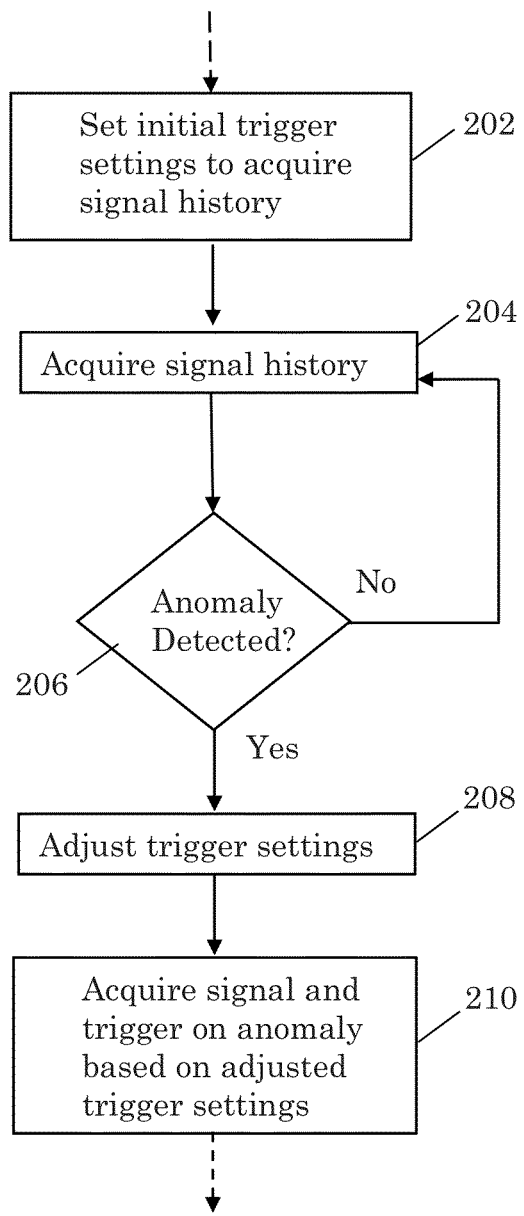
FIG. 4 is a flow chart showing smart trigger analysis.

If used in conjunction with mask failures, a fully automated mode may be used to detect anomalies and arrange trigger settings without user intervention. FIG. 4 is a flow chart showing smart triggering analysis. It should be understood that any flowcharts contained herein are illustrative only and that other program entry and exit points, time out functions, error checking routines and the like (not shown) would normally be implemented in typical system software. It is also understood that system software may run continuously after being launched. Accordingly, any beginning and ending points are intended to indicate logical beginning and ending points of a portion of code that can be integrated with other portions of code and executed as needed. The order of execution of any of the blocks may also be varied without departing from the scope of this disclosure. Implementation of these aspects is readily apparent and well within the grasp of those skilled in the art based on the disclosure herein.

Smart trigger analysis generally begins with configuring the test and measurement instrument to trigger on a test signal in order to capture a number (n) of acquisitions of the signal as shown by block 202. For example an edge trigger may be used to acquire the number (n) of acquisitions and store the acquisition in memory as a signal history as shown by block 204. Once the signal history is completed the smart trigger analysis software 74 is used to review the signal history in order to detect the anomaly as shown by block 206. The smart trigger software 74 may be operated automatically, semi-automatically and manually (as discussed above) to identify a set of modified trigger settings for triggering on the anomaly. The trigger settings are modified as shown by block 210. The modified trigger settings, e.g., stored in block 55, are used to configure the trigger circuitry to trigger on the anomaly only. The test and measurement instrument is now configured to acquire a signal and trigger directly on the anomaly.

Returning to FIG. 2, the smart trigger analysis software 74 may be configured to select the best method between the various anomaly detection methods 60, 62, 64. For example, each of the anomaly detection methods may generate a score and the smart trigger analysis software 74 may select the highest scoring anomaly detection methods to generate the host output 76. In such a configuration, OR gate 66 may be replaced with a suitable element such that the results from multiple anomaly detection methods may be transferred to the host processor 70. In the alternative, the smart trigger analysis software 74 may combine the results from the various anomaly detection methods 60, 62, 64, e.g., using an average, weighted average or the like. Host output 76 represents trigger, e.g., hardware and/or software, results from the smart trigger analysis.

The host output 76 is coupled to the trigger circuitry 48 via multiplexer 78. One or more triggering modes 80 may be used to trigger based on the timing information provided by the host output 76. In this example, pulse, runt, delay, edge and rise/fall, 82-90 triggering modes are shown. It should be understood that other triggering modes may be used without departing from the scope of this disclosure. The trigger outputs are coupled to trigger output multiplexer 92 and may be used to trigger the test and measurement instrument. Line 94 generally illustrates the end result of the smart trigger setup, e.g., once the modified trigger settings are determined using the smart trigger analysis software 74 and stored in an appropriate memory as shown by block 55.

It should be understood that many variations are possible based on the disclosure herein. Although features and elements are described above in particular combinations, each feature or element can be used alone without the other features and elements or in various combinations with or without other features and elements. The apparatus or methods disclosed herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A test and measurement instrument, comprising:
an input terminal configured to receive a signal captured by the test and measurement instrument;
an acquisition engine coupled to the input terminal, the acquisition engine being configured to digitize the signal and store the digitized signal as a signal history in an acquisition memory based on initial trigger settings;
an anomaly detector coupled to the acquisition memory, the anomaly detector being configured to detect an anomaly in the signal history;
an analysis engine coupled to the anomaly detector, the analysis engine being configured to analyze the anomaly detected in the signal history and generate modified trigger settings for detecting the anomaly; and
trigger circuitry coupled to the analysis engine, the trigger circuitry being configured to trigger based on the modified trigger settings.

2. The test and measurement instrument of claim 1, wherein the anomaly detector is configured to detect the anomaly based on at least one of a mask event, segmented memory and an acquisition histogram.

3. The test and measurement instrument of claim 1, wherein the acquisition engine is configured to acquire a predetermined number of acquisitions as a signal history.

4. The test and measurement instrument of claim 1, wherein the analysis engine is configured to generate a mask based on the signal history.

5. The test and measurement instrument of claim 1, wherein the analysis engine is configured to receive a user input specifying a location of the anomaly.

6. The test and measurement instrument of claim 1, wherein the anomaly detector may be configured with at least one threshold criteria for detecting the anomaly.

7. The test and measurement instrument of claim 1, wherein the analysis engine is configured to automatically select at least one anomaly detection technique from a plurality of anomaly detection techniques.

8. The test and measurement instrument of claim 1, wherein the analysis engine is configured to automatically select one anomaly detection technique from a plurality of anomaly detection techniques based on a score.

9. The test and measurement instrument of claim 1, wherein the initial trigger settings are configured to capture a history of the signal independent of the anomaly signal.

10. A method of detecting an anomaly in a test and measurement instrument, the method comprising:
receiving a signal at the test and measurement instrument;

digitizing the signal and storing the digitized signal as a signal history in an acquisition memory based on initial trigger settings;

detecting an anomaly in the signal history;

analyzing the anomaly detected in the signal history and generating modified trigger settings configured to detect the anomaly; and configuring trigger circuitry to trigger based on the modified trigger settings.

11. The method of claim 10, further comprising detecting the anomaly based on at least one of a mask event, segmented memory and an acquisition histogram.

12. The method of claim 10, further comprising acquiring a predetermined number of acquisitions as a signal history.

13. The method of claim 10, further comprising generating a mask based on the signal history.

14. The method of claim 10, further comprising receiving a user input specifying a location of the anomaly.

15. The method of claim 10, further comprising detecting the anomaly based on at least one threshold criteria.

16. The method of claim 10, further comprising automatically selecting at least one anomaly detection technique from a plurality of anomaly detection techniques.

17. The method of claim 10, further comprising automatically selecting one anomaly detection technique from a plurality of anomaly detection techniques based on a score.

18. The method of claim 10, wherein the initial trigger settings are configured to capture a history of the signal independent of the anomaly.

19. The method of claim 10, further comprising receiving a second signal and triggering based on the modified trigger settings.

\* \* \* \* \*